United States Patent
Lakshmanan et al.

(10) Patent No.: US 11,587,829 B2
(45) Date of Patent: *Feb. 21, 2023

(54) DOPING CONTROL OF METAL NITRIDE FILMS

(71) Applicant: Applied Materials, Inc., Santa Clara, CA (US)

(72) Inventors: Annamalai Lakshmanan, Fremont, CA (US); Ben-Li Sheu, Sunnyvale, CA (US); Guodan Wei, San Ramon, CA (US); Nicole Lundy, Meridian, ID (US); Paul F. Ma, Scottsdale, AZ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 17/143,594

(22) Filed: Jan. 7, 2021

(65) Prior Publication Data
US 2021/0159118 A1    May 27, 2021

Related U.S. Application Data

(63) Continuation of application No. 16/545,340, filed on Aug. 20, 2019, now Pat. No. 10,910,263, which is a continuation of application No. 15/989,635, filed on May 25, 2018, now Pat. No. 10,431,493, which is a continuation of application No. 15/601,525, filed on May 22, 2017, now Pat. No. 10,008,412, which is a continuation of application No. 14/169,937, filed on Jan. 31, 2014, now Pat. No. 9,659,814.

(Continued)

(51) Int. Cl.
*H01L 21/768* (2006.01)
*H01L 21/285* (2006.01)
*H01L 23/532* (2006.01)

(52) U.S. Cl.
CPC .. *H01L 21/76856* (2013.01); *H01L 21/28562* (2013.01); *H01L 21/76831* (2013.01); *H01L 21/76841* (2013.01); *H01L 21/76844* (2013.01); *H01L 21/76862* (2013.01); *H01L 21/76867* (2013.01); *H01L 23/53238* (2013.01); *H01L 2924/0002* (2013.01)

(58) Field of Classification Search
None
See application file for complete search history.

(56) References Cited

U.S. PATENT DOCUMENTS 6,071,809 A    6/2000  Zhao
6,391,462 B1   5/2002  Jang
(Continued)

OTHER PUBLICATIONS

Burton, B.B., et al., "Tantalum Nitride Atomic Layer Deposition Using (tert-Butylimido)tris(diethylamido)tantalum and Hydrazine", Journal of the Electrochemical Society vol. 155 No. 7, 2008, D508-D516.

*Primary Examiner* — Mounir S Amer
(74) *Attorney, Agent, or Firm* — Servilla Whitney LLC

(57) ABSTRACT

Described are methods for controlling the doping of metal nitride films such as TaN, TiN and MnN. The temperature during deposition of the metal nitride film may be controlled to provide a film density that permits a desired amount of doping. Dopants may include Ru, Cu, Co, Mn, Mo, Al, Mg, Cr, Nb, Ta, Ti and V. The metal nitride film may optionally be exposed to plasma treatment after doping.

19 Claims, 2 Drawing Sheets

Related U.S. Application Data

(60) Provisional application No. 61/759,761, filed on Feb. 1, 2013.

(56) References Cited

U.S. PATENT DOCUMENTS

| | | |
|---|---|---|
| 6,878,206 B2 | 4/2005 | Tzu et al. |
| 6,916,398 B2 | 7/2005 | Chen et al. |
| 7,780,785 B2 | 8/2010 | Chen et al. |
| 8,013,445 B2 | 9/2011 | Lee et al. |
| 10,431,493 B2 * | 10/2019 | Lakshmanan ..... H01L 21/76841 |
| 2002/0055270 A1 | 5/2002 | Narwankar |
| 2005/0196929 A1 | 9/2005 | Yuan et al. |
| 2006/0063396 A1 | 3/2006 | Bankstahl |
| 2006/0128128 A1 | 6/2006 | Hintze et al. |
| 2009/0321877 A1 | 12/2009 | Wang |
| 2010/0021119 A1 | 1/2010 | Ohtsu et al. |
| 2010/0052176 A1 | 3/2010 | Kamada et al. |
| 2010/0102417 A1 | 4/2010 | Ganguli et al. |
| 2011/0028002 A1 * | 2/2011 | Hirota ............... H01L 27/10852 438/761 |
| 2011/0256701 A1 | 10/2011 | Xu et al. |
| 2012/0056265 A1 | 3/2012 | Liang et al. |
| 2013/0009257 A1 | 1/2013 | Ando et al. |
| 2013/0087859 A1 | 4/2013 | Liang |
| 2013/0203266 A1 | 8/2013 | Hintze et al. |
| 2014/0017906 A1 | 1/2014 | Fu |
| 2014/0170422 A1 | 6/2014 | Wang et al. |

\* cited by examiner

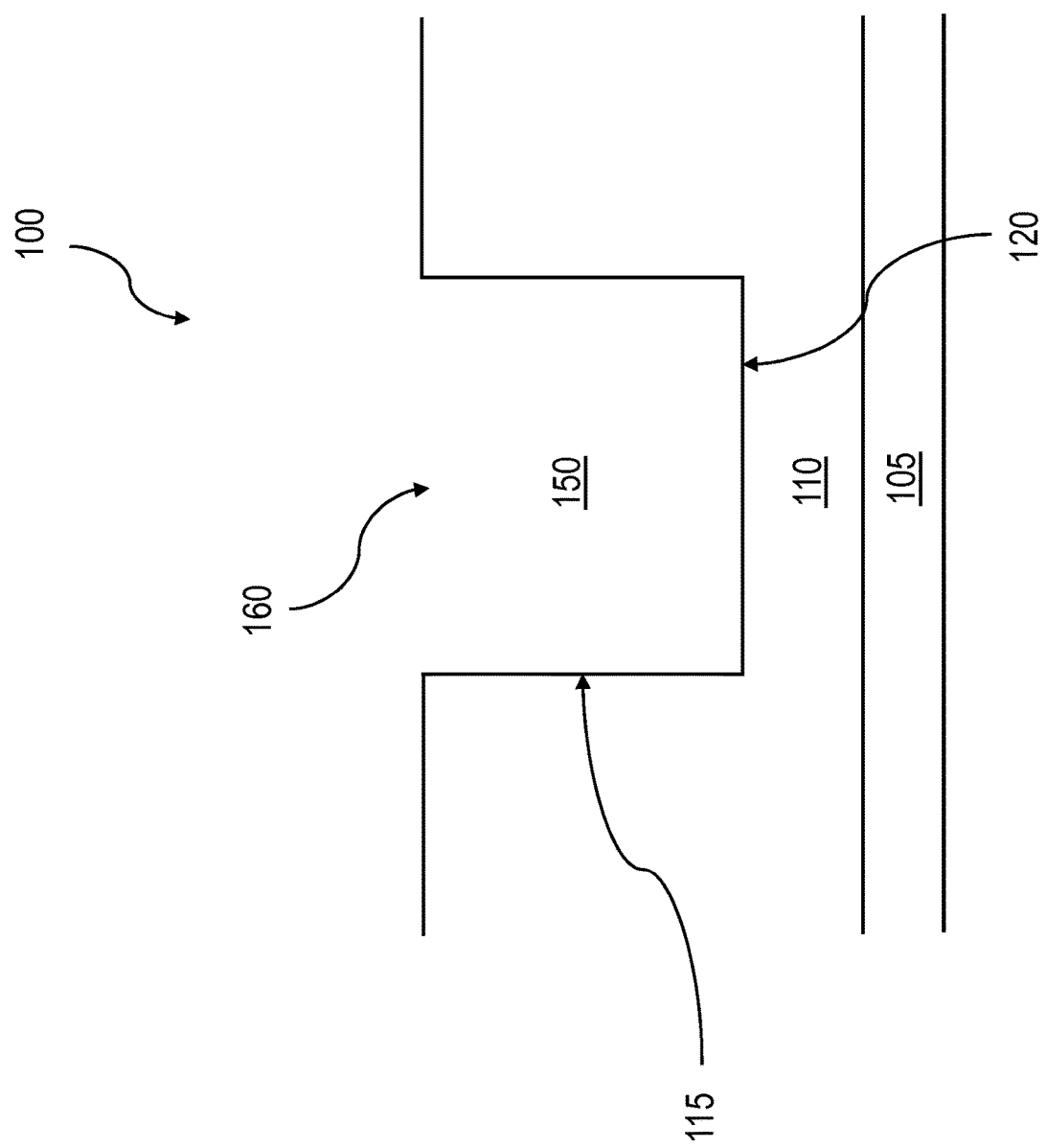

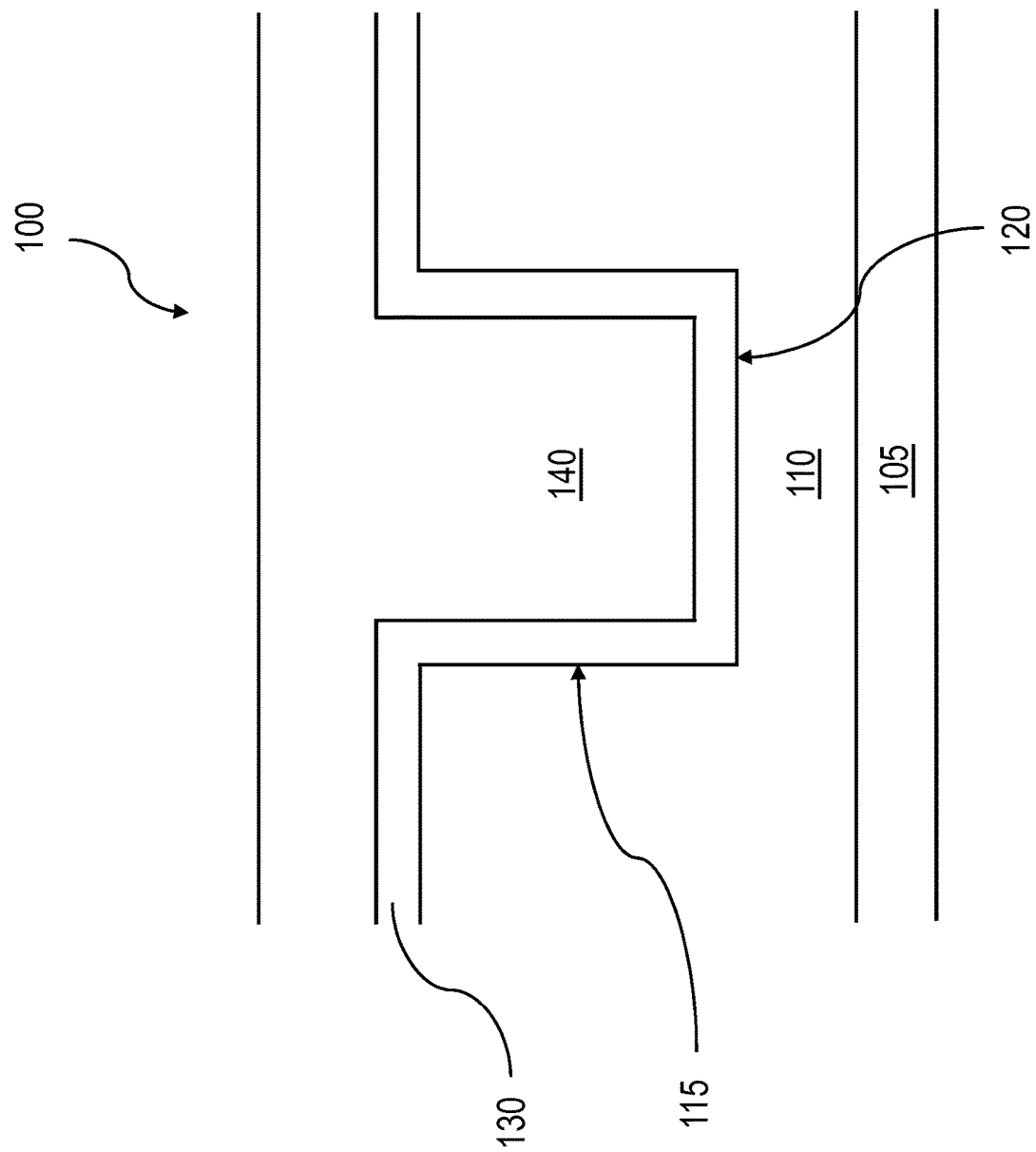

DOPING CONTROL OF METAL NITRIDE FILMS

CROSS-REFERENCE TO RELATED APPLICATIONS

This application is a continuation of U.S. patent application Ser. No. 16/545,340, filed Aug. 20, 2019, which is a continuation of U.S. patent application Ser. No. 15/989,635, filed May 25, 2018, issued Oct. 1, 2019 as U.S. Pat. No. 10,431,493, which is a continuation of U.S. patent application Ser. No. 15/601,525, filed May 22, 2017, issued Jun. 26, 2018 as U.S. Pat. No. 10,008,412 which is a continuation of U.S. patent application Ser. No. 14/169,937, filed Jan. 31, 2014, issued May 23, 2017 as U.S. Pat. No. 9,659,814, which claims priority to U.S. Provisional Application No. 61/759,761, filed Feb. 1, 2013, the entire disclosures of which are hereby incorporated by reference herein.

FIELD

The present invention relates generally to methods of doping metal nitride films in semiconductor devices.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections. Such electromigration may adversely affect the electrical properties of various components of the integrated circuit.

Tantalum nitride (TaN) is a copper barrier at film thicknesses greater than 10 Å, where the film is continuous. However, at nodes below 22 nm, TaN deposited by thermal atomic layer deposition (thermal ALD) is not a good copper barrier layer. Therefore, there is a need for new methods for depositing films that are effective copper barriers.

SUMMARY

One aspect of the present invention pertains to a method for depositing a doped metal nitride film on a substrate, the method comprising depositing a metal nitride film on the substrate at a temperature selected to provide a film having a predetermined film density, and exposing the metal nitride film to a dopant metal precursor to form a doped metal nitride film.

In various embodiments, the metal nitride film comprises one or more of TaN, TiN and MnN. The metal nitride film may be doped with one or more of Ru, Cu, Co, Mn, Mo, Al, Mg, Cr, Nb, Ta, Ti and V, or similar dopant metals.

Some embodiments provide that the metal nitride film is deposited at a temperature less than or equal to about 350° C. or less than or equal to about 250° C. The predetermined film density may be less than or equal to about 8.5 g/cm$^3$.

In some embodiments, the metal nitride film may be deposited via atomic layer deposition. The metal nitride film may optionally be exposed to plasma treatment after doping.

Another aspect of the present invention pertains to a method for controlling the doping of a metal nitride film, the method comprising controlling the temperature during deposition of a metal nitride film to control the density of the deposited metal nitride film and exposing the metal nitride film to a dopant metal precursor to form a doped metal nitride film.

As with the first aspect, in some embodiments, the metal nitride film comprises one or more of TaN, TiN and MnN. Also in some embodiments, the metal nitride film is doped with one or more of Ru, Cu, Co, Mn, Mo, Al, Mg, Cr, Nb, Ta, Ti and V.

In one or more embodiments, the temperature is controlled such that the temperature during deposition of the metal nitride film does not exceed about 350° C. or does not exceed about 250° C. The temperature during doping may also be controlled, such as controlling the temperature during doping so that the temperature does not exceed about 250° C.

In some embodiments, the metal nitride film is deposited via atomic layer deposition. The metal nitride film may optionally be exposed to plasma treatment after doping.

Another aspect of the present invention relates to a method for depositing a barrier film, the method comprising depositing a metal nitride film on a dielectric film on a substrate surface, wherein the temperature during the metal nitride deposition is controlled to control the density of the metal nitride film; doping the metal nitride film with one or more dopants; and diffusing one or more of the dopants through the metal nitride film to the dielectric film.

In one or more embodiments, the dopant and the dielectric film react to provide a metal oxide film or a metal silicate film. In some embodiments, the dopant comprises one or more of Al and Mn and the metal oxide film or metal silicate film comprises one or more of $Al_2O_3$, MnO and $MnSiO_x$.

Some embodiments provide that the temperature during deposition of the metal nitride film may be selected to provide a desired amount of doping for the metal nitride film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A and 1B illustrate a dielectric layer before and after deposition of a barrier layer and conductive fill material in accordance with one or more embodiments of the invention.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. Although specific reference is made to copper barrier layers for semiconductor trenches in the following description, it is to be understood that the processes, films and devices described herein are suitable for any appropriate use of doped metal nitride films.

One or more embodiments of the present invention provide methods of depositing a doped metal nitride film. Such metal nitride films may include, but are not limited to, tantalum nitride (TaN), titanium nitride (TiN) and manganese nitride (MnN). The metal nitride films may be doped with one or more of Ru, Cu, Co, Mn, Mo, Al, Mg, Cr, Nb, Ta, Ti, V, similar dopants or combinations thereof.

It has surprisingly been found that the density of the metal nitride film influences the amount of dopant incorporated into the metal nitride film. At lower metal nitride film densities, higher amounts of dopants may be incorporated into the metal nitride film. Conversely, higher metal nitride film densities limit the amounts of dopants that can be incorporated. Therefore, controlling the density of the metal nitride film during deposition and subsequent processing prior to doping can be used to control the final doping of the metal nitride film. Furthermore, dopants may strengthen the overall metal nitride layer, particularly for films with lower density, by filling the holes in the matrix of the metal nitride.

Accordingly, one aspect of the present invention pertains to a method for depositing a doped metal nitride film on a substrate. In one or more embodiments, the method comprises depositing a metal nitride film on the substrate at a temperature selected to provide a metal nitride film having a predetermined film density. The metal nitride film is then subjected to doping, such as by exposing the metal nitride film to a dopant metal precursor.

In general, the higher the temperature during deposition of the metal nitride film, the higher the density of the resulting metal nitride film. For example, TaN has a density of about 9.5 $g/cm^3$ when deposited by atomic layer deposition (ALD) at 275° C. and a density of about 8.5 $g/cm^3$ when deposited by ALD at 225° C. Accordingly, the temperature during deposition of the metal nitride layer may be selected to provide a desired density for the metal nitride film. In various embodiments, the temperature during deposition of the metal nitride film does not exceed about 350° C., such as not exceeding about 300° C., about 275° C., about 250° C., about 225° C., about 200° C., about 175° C. or about 150° C. In some embodiments the temperature is in the range from about 100° C. to about 350° C. In some embodiments, the temperature is in the range from about 100° C. to about 250° C. The temperature during deposition may vary depending on the desired amount of doping, the type of metal nitride film, and/or the type of precursors used to deposit the metal nitride film.

The predetermined film density may vary depending on the desired amount of doping. In various embodiments, the predetermined film density may be less than or equal to about 13 $g/cm^3$, about 12 $g/cm^3$, about 11 $g/cm^3$, about 10 $g/cm^3$, about 9.5 $g/cm^3$, about 9 $g/cm^3$, about 8.5 $g/cm^3$, about 8 $g/cm^3$, about 7.5 $g/cm^3$, about 7 $g/cm^3$, about 6.5 $g/cm^3$, about 6 $g/cm^3$, about 5.5 $g/cm^3$, about 5 $g/cm^3$, about 4.5 $g/cm^3$, about 4 $g/cm^3$, about 3.5 $g/cm^3$, about 3 $g/cm^3$, about 2.5 $g/cm^3$, about 2 $g/cm^3$, about 1.5 $g/cm^3$ or about 1 $g/cm^3$.

The thickness of the doped metal nitride film may be defined by the thickness of the initial metal nitride film prior to doping. In one or more embodiments the thickness of the metal nitride film is in the range from 5 Å to 15 Å. In various embodiments, the metal nitride film thickness is about 6 Å, about 7 Å, about 8 Å, about 9 Å, about 10 Å, about 11 Å or about 12 Å.

In some embodiments, the metal nitride film is not subjected to any subsequent processing that increases the density before doping the metal nitride film. For example, exposing the metal nitride film to plasma treatment may increase the density of the metal nitride film. Accordingly, some embodiments provide that there is no plasma treatment during deposition of the metal nitride film, or between deposition of the metal nitride film and doping of the metal nitride film.

In one or more embodiments, the doped metal nitride film comprises 0.01 to 30 wt. % dopant, based on the total weight of the metal nitride film. In certain embodiments, the doped metal nitride film comprises 0.1 to 10 wt. % dopant, such as from 0.2 to 8 wt. % dopant. In some embodiments, the metal nitride film comprises 0.5 to 5 wt. % dopant, such as about 0.5 wt. %, about 1 wt. %, about 1.5 wt. %, about 2 wt. %, about 2.5 wt. %, about 3 wt. %, about 3.5 wt. %, about 4 wt. %, about 4.5 wt. %, or about 5 wt. % dopant.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

In one or more embodiments, the metal nitride layer may be deposited via ALD. In a typical ALD process, alternating pulses or flows of "A" precursor and "B" precursor can be used to deposit a film. As used in this specification and the appended claims, the terms "precursor", "reactant", "reactive gas", "reactive species" and the like are used interchangeably to describe a chemical species that is intended to act (e.g., deposit, chemisorb, etch) on a substrate surface or film on the substrate. The alternating exposure of the surface to reactants "A" and "B" is continued until the desired thickness film is reached. However, instead of pulsing the reactants, the gases can flow simultaneously from one or more gas delivery head or nozzle and the substrate and/or gas delivery head can be moved such that the substrate is sequentially exposed to each of the reactive gases. Of course, the aforementioned ALD cycles are merely exemplary of a wide variety of ALD process cycles in which a deposited layer is formed by alternating layers of precursors and co-reactants.

In some embodiments, the substrate is laterally moved from a first region in a processing chamber where it is exposed to a first reactive gas, then laterally moved through a gas curtain into a second region of the processing chamber where it is exposed to a second reactive gas. In one or more embodiments, the substrate can continue to be laterally moved to a third region, fourth region, etc. of the processing chamber where the substrate can be exposed other reactive gases. Each of the regions in the processing chamber may be separated from adjacent regions by a gas curtain which prevents or minimizes gas phase reaction of the reactive species in the respective regions. In some embodiments, the substrate can be rotated laterally about the inside of a processing chamber, exposing the substrate to anywhere from one to n processing regions. In this manner, a metal nitride film can be deposited and doped without having to move the substrate to a different processing chamber.

Some embodiments of the invention are directed to copper barrier applications. The metal nitride film formed by one or more embodiments of the invention is used as a copper barrier. Suitable metal nitride films for copper barrier applications include, but are not limited to, TaN and MnN. For copper barrier applications, suitable dopants include, but are not limited to, Ru, Cu, Co, Mn, Al, Ta or combinations thereof. A plasma treatment can be used after doping to densify the metal nitride matrix and stabilize the dopant in the metal nitride matrix. In some copper barrier applications, a high frequency plasma (defined as greater than about 14 MHz or about 40 MHz or greater) can be used with one or more of $H_2$ and Ar gas. In one or more embodiment, to prevent low-k damage, a higher plasma frequency can be used (higher than 13.56 MHz). In some embodiments, the metal nitride film is a copper barrier and comprises one or more of (a) TaN doped with Mn (b) MnN doped with Ru (c) MnN doped with Cu or combinations thereof.

Suitable precursors for depositing a metal nitride film include metal-containing precursors and N-containing precursors. For example, if the metal nitride film is TaN, the Ta-containing precursor may be pentakis(dimethylamino) tantalum (PDMAT) and the N-containing precursor may be ammonia. If the metal nitride film is MnN, the Mn-containing precursors may be bis[bis(trimethylsilyl)amido]manganese(II) $(Mn(TMSA)_2)$. Other suitable precursors are known to those skilled in the art. Organic species in organic-containing precursors for metal nitride films may get partially incorporated into the underlying layer (such as a dielectric layer), which may increase the adhesion at the metal nitride-underlying layer interface.

For depositing the dopant metal, an appropriate metal-containing precursor may be used. Examples of suitable precursors include metal complexes containing the desired dopant, such as dopant metals coordinated with organic or carbonyl ligands. A suitable dopant precursor should have sufficient vapor pressure to be deposited in the appropriate process, such as ALD, chemical vapor deposition (CVD) and physical vapor deposition (PVD). For example, dimethylaluminum hydride (DMAH) may be used as an Al-containing precursor or $Mn(TMSA)_2$ may be used as a Mn-containing precursor.

Depending on the dopant precursor used, a co-reactant may be used to deposit the dopant. For example, reducing gases such as hydrogen and ammonia can be used as co-reactants for depositing some dopants. Metal dopant precursors and co-reactants may be either co-flowed or flowed sequentially.

In some embodiments, instead of or in addition to using a reducing gas co-reactant, a post-plasma treatment step may be used after exposing the metal nitride film to the dopant metal precursor. According to one or more embodiments, the plasma comprises one or more of He, Ar, $NH_3$, $H_2$ and $N_2$. In some embodiments, the plasma may comprise a mixture of Ar and $H_2$, such as a mixture having an Ar:$H_2$ molar ratio in the range from 1:1 to 1:10. The plasma power may be in the range from about 400 to about 1000 Watts. The plasma frequency may be in the range from 350 kHz to 40 MHz. The plasma treatment time may vary from 5 second to 60 seconds, such as in the range from 10 seconds to 30 seconds. In some embodiments, the pressure during plasma treatment may be in the range from 0.5 to 50 Torr, such as from 1 to 10 Torr. In some embodiments, the wafer spacing may be in the range from 100 mils to 600 mils.

The metal nitride film may be exposed to the dopant metal precursor during deposition, i.e. the dopant metal precursor may be used sequentially in the ALD cycle to provide a doped metal nitride film. For example, 1-10 cycles of metal-containing precursors and N-containing precursors can be used to form an initial metal nitride layer, followed by exposure to 1-10 cycles of the dopant metal precursor, then resuming cycles of the metal-containing precursors and N-containing precursors, then optionally more doping, etc., until the desired doped metal nitride film thickness is reached. Alternatively, the metal nitride film may be completely deposited to the desired thickness before exposing to the dopant metal precursors.

In various embodiments, the duration of the exposure to the dopant metal-containing precursor may range from 1 to 60 seconds, such as in the range from 3 to 30 seconds or from 5 to 10 seconds. Longer exposures to the dopant metal precursor will increase the amount of doping of the metal nitride film, as long as the metal nitride film has not reached the maximum doping for the density of the metal nitride film.

Another aspect of the present invention pertains to a method for controlling the doping of a metal nitride film. In various embodiments of this aspect, the method comprises controlling the temperature during deposition of a metal nitride film to control the density of the deposited metal nitride film and exposing the metal nitride film to a dopant metal precursor to form a doped metal nitride film. The metal nitride film may be deposited according to any of the previously described methods of deposition, such as ALD.

As explained above, the temperature during deposition of the metal nitride film influences the density of the resulting metal nitride film. As such, controlling the temperature during deposition of a metal nitride film will enable control of the density of the deposited metal nitride film, which in turn will enable control of the doping of the metal nitride film. Indeed, the doping of the metal nitride film may be self-limiting based on the density of the metal nitride film.

In various embodiments of this method, the temperature is controlled during deposition of the metal nitride film so that the temperature does not exceed about 350° C., such as not exceeding about 300° C., about 275° C., about 250° C., about 225° C., about 200° C., about 175° C. or about 150° C. In some embodiments the temperature is in the range from about 100° C. to about 350° C. In some embodiments, the temperature is in the range from about 100° C. to about 250° C. Again, the temperature during deposition may vary depending on the desired amount of doping, the type of metal nitride film, and/or the type of precursors used to deposit the metal nitride film.

In some embodiments, the method further comprises controlling the temperature during doping. Use of lower temperatures may help prevent decomposition of the dopant metal precursors, which can further increase the capability to dope the metal nitride film. In various embodiments, the temperature during doping may be controlled such that it does not exceed 350° C., such as not exceeding about 300° C., about 275° C., about 250° C., about 225° C., about 200° C., about 175° C. or about 150° C. In some embodiments the temperature is in the range from about 100° C. to about 350° C. In some embodiments, the temperature is in the range from about 100° C. to about 250° C.

The method of this aspect may include any of the features described with the first aspect. For example, in some embodiments, the metal nitride films may be treated with plasma after doping.

One exemplary use of these metal nitride films is as barrier layers in microelectronic devices. Accordingly, another aspect of the present invention pertains to a method for depositing a barrier film. In one or more embodiments of this aspect, the method comprises depositing a metal nitride film on a dielectric film on a substrate surface, wherein the temperature during the metal nitride deposition is controlled to control the density of the metal nitride film and doping the metal nitride film with one or more dopants. The method may further comprise diffusing one or more of the dopants through the metal nitride film to the dielectric film.

While not wishing to be bound to any particular theory, it is thought that the dopant can selectively diffuse through the barrier layer to the dielectric layer and form a complex with the dielectric material that will be resistant to electromigration. One proposed mechanism is that the exposed precursor can preferentially migrate to the dielectric/barrier interface via grain boundaries or other weak paths. The complex formed may be a metal oxide ($MO_x$) or a metal silicate ($MSi_xO_y$). Thus, in embodiments where the dopant is Mn and the dielectric layer comprises SiOx, the Mn can diffuse through the barrier layer and form MnO or $MnSiO_x$. This self-forming barrier layer of $MnSi_xO_y$ can then prevent copper electromigration from the conductive material to the dielectric layer. Similarly, if the dopant metal is Al, the complex may be $Al_2O_3$.

FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer. In certain embodiments, the dielectric layer comprises $SiO_x$. Further embodiments provide that the dielectric layer comprises porous or carbon-doped $SiO_x$. In some embodiments, the dielectric layer is a porous or carbon-doped $SiO_x$ layer with a k value less than 3.

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120. The barrier layer 130 may comprise a metal nitride layer including one or more of TaN, TiN and MnN and one or more dopants such as Ru, Cu, Co, Mn, Mo, Al, Mg, Cr, Nb, Ta, Ti and V. According to one or more embodiments, the barrier layer comprises TaN and the dopant comprises one or more of Al and Mn.

A conductive fill material 140 fills at least a portion of the trench 150 lined with barrier layer 130. According to one or more embodiments, the conductive fill material comprises copper or a copper alloy. In further embodiments, the conductive fill material also comprises Mn. In other embodiments, the conductive fill material further comprises Al.

Although the conductive fill material 140 in FIG. 1B is shown in direct contact with the barrier layer 130, intermediate layers may be in between the conductive fill material 140 and the barrier layer 130, such as adhesion layers or seeding layers. According to one or more embodiments, the microelectronic device further comprises an adhesion layer comprising one or more of Ru and Co. In addition to Ru and/or Co, the adhesion layer may comprise one or more dopants such as Mn, Al, Mg, Cr, Nb, Ti or V. In some embodiments, the adhesion layer comprises Ru and Mn. In other embodiments, the adhesion layer comprises Co and Mn.

In certain embodiments, a seeding layer is deposited on top of the barrier layer. According to one or more embodiments, the seeding layer comprises an alloy of copper, such as a Cu—Mn alloy. In certain embodiments, the seeding layer comprises less than 2 wt. % Mn. In some embodiments, the seeding layer comprises about 1 wt. % Mn. The line resistance of copper alloys containing 1 wt. % Mn is expected to be the same as or similar to the line resistance of pure copper.

In addition to being a copper barrier, doped metal nitride may also be a barrier to oxygen diffusing from the dielectric layer 110 to the conductive material 140. Oxygen diffusion from the dielectric layer 110 to the conductive material 140 can result in oxygen reacting with components in the conductive material and/or seed layer. For example, if the conductive material 140 comprises Mn, then oxygen can react with the Mn at the interface of the barrier layer 130 and the conductive material 140, thus "pinning" the Mn to the barrier layer/conductive material interface. As a result, the Mn cannot segregate throughout the conductive material. Similarly, if a seed layer comprising Mn is present, then oxygen can react with the Mn in the seed layer at the seed layer/barrier layer interface and pin the Mn to the interface.

It is believed that oxygen diffusing into the metal nitride layer will react with the dopant and will prevent oxygen from diffusing into the conductive material 140. As a result, oxygen will not be available to react with the seed layer or the conductive material.

As embodiments of the invention provide methods for depositing or forming doped metal nitride films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

Another aspect of the invention pertains to an apparatus for deposition of a film on a substrate to perform a process according to any of the embodiments described above. In one embodiment, the apparatus comprises a deposition chamber for deposition of a film on a substrate. The chamber comprises a process area for supporting a substrate. The apparatus includes a precursor inlet in fluid communication with a supply of a metal precursor precursor, such as pentakis(dimethylamino)tantalum (PDMAT) for Ta. The apparatus also includes a reactant gas inlet in fluid communication with a supply of nitrogen-containing precursor, such as ammonia. The apparatus also includes a reactant gas inlet in fluid communication with a supply of dopant precursor, such as a dopant-containing metal complex. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat. The metal nitride film may be doped in the same chamber as the metal nitride film deposition, or it may be doped in a separate chamber that is in communication with the deposition chamber under load lock or vacuum conditions.

In some embodiments, a plasma system and processing chambers or systems which may be used during methods described here for depositing or forming the films can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780, 785.

EXAMPLES

Example 1

Mn Doping of TaN

10 A of TaN was deposited via ALD using PDMAT and ammonia precursors at 225° C. The TaN film density was 8.5 g/cm$^3$. The TaN was doped with Mn by exposing to Mn(TMSA)$_2$ for 3 seconds, followed by 10 second exposure to H$_2$ plasma. The dopant exposure conditions were 5 Torr, 200 mil spacing, 1000 SCCM Ar carrier flow and 1500 SCCM Ar purge flow. The H$_2$ plasma conditions were 1 Torr, 100 mil spacing, 400 W (40 MHz), 300 SCCM Ar and 2500 SCCM H$_2$.

Example 2

MnN Deposition on TaN

10 A of TaN was deposited in the same manner as Example 1. 0.5 A of MnN was then deposited upon the TaN via ALD using Mn(TMSA)$_2$ and ammonia precursors at 225° C. The TaN/MnN was then exposed to the same H$_2$ plasma treatment as in Example 1.

Example 3

Al Doping of TaN

10 A of TaN was deposited in the same manner as Example 1. The TaN was doped with Al by exposing to DMAH and H$_2$ gas for 5 seconds. The aluminum exposure conditions were 5 Torr, 200 mils spacing, 1000 SCCM Ar carrier flow, 1500 SCCM Ar purge flow, and H$_2$ flow of 1000 SCCM. The Al-doped TaN was then subjected to a 30 second exposure to the same H$_2$ plasma treatment as in Examples 1 and 2.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method for depositing a doped metal nitride film on a substrate, the method comprising:
   depositing a metal nitride film on the substrate at a predetermined temperature to provide a film having a predetermined film density; and
   exposing the metal nitride film to a vaporized dopant metal precursor to form a doped metal nitride film.

2. The method of claim 1, wherein the metal nitride film comprises one or more of TaN, TiN and MnN.

3. The method of claim 1, wherein the metal nitride film is doped with one or more of Ru, Cu, Co, Mn, Mo, Al, Mg, Cr, Nb, Ta, Ti and V.

4. The method of claim 1, wherein the predetermined temperature is less than or equal to about 350° C.

5. The method of claim 1, wherein the metal nitride film comprises one or more of MnN doped with Ru, TaN doped with Mn, MnN doped with Cu or combinations thereof.

6. The method of claim 1, wherein the predetermined film density is less than or equal to about 8.5 g/cm$^3$.

7. The method of claim 1, further comprising exposing the metal nitride film to plasma treatment after forming the doped metal nitride film.

8. The method of claim 1, wherein the doped metal nitride film comprises 0.01 to 30 wt. % dopant.

9. The method of claim 8, wherein the doped metal nitride film comprises 0.01 to 10 wt. % dopant.

10. The method of claim 1, wherein exposing the metal nitride film to the vaporized dopant metal precursor comprises a CVD or ALD process.

11. A method for controlling doping of a metal nitride film, the method comprising:
   selecting a deposition temperature to provide a predetermined density of a metal nitride film;
   depositing a metal nitride film with the predetermined density at the deposition temperature; and
   exposing the metal nitride film to a vaporized dopant metal precursor to form a doped metal nitride film.

12. The method of claim 11, wherein the metal nitride film comprises one or more of TaN, TiN and MnN.

13. The method of claim 11, wherein the dopant metal precursor comprises one or more of Ru, Cu, Co, Mn, Mo, Al, Mg, Cr, Nb, Ta, Ti and V.

14. The method of claim 11, wherein deposition temperature does not exceed about 350° C.

15. The method of claim 11, wherein the metal nitride film is deposited via atomic layer deposition.

16. The method of claim 11, further comprising exposing the doped metal nitride film to a plasma treatment.

17. The method of claim 11, wherein the doped metal nitride film comprises 0.01 wt. % to 30 wt. % of a dopant from the dopant metal precursor.

18. The method of claim 17, wherein the doped metal nitride film comprises 0.01 wt. % to 10 wt. % of a dopant from the dopant metal precursor.

19. The method of claim 11, wherein exposing the metal nitride film to the vaporized dopant metal precursor comprises a CVD or ALD process.

* * * * *